(12) United States Patent
Nagaike

(10) Patent No.: US 8,154,876 B2
(45) Date of Patent: Apr. 10, 2012

(54) CIRCUIT BOARD MODULE AND ELECTRONIC APPARATUS

(75) Inventor: Shotaro Nagaike, Kanagawa (JP)

(73) Assignee: Panasonic Corporation, Osaka (JP)

( * ) Notice: Subject to any disclaimer, the term of this patent is extended or adjusted under 35 U.S.C. 154(b) by 45 days.

(21) Appl. No.: 12/863,179

(22) PCT Filed: Oct. 16, 2008

(86) PCT No.: PCT/JP2008/002937
§ 371 (c)(1),
(2), (4) Date: Jul. 15, 2010

(87) PCT Pub. No.: WO2009/090693
PCT Pub. Date: Jul. 23, 2009

(65) Prior Publication Data
US 2010/0328903 A1 Dec. 30, 2010

(30) Foreign Application Priority Data
Jan. 15, 2008 (JP) .................. 2008-005458

(51) Int. Cl.
*H05K 1/00* (2006.01)
(52) U.S. Cl. ....................... 361/748; 174/250
(58) Field of Classification Search .......... 361/748, 361/760, 800, 807, 829; 174/250, 260, 255
See application file for complete search history.

(56) References Cited

U.S. PATENT DOCUMENTS

| 7,161,252 B2 * | 1/2007 | Tsuneoka et al. | 257/787 |
| 7,362,585 B2 * | 4/2008 | Chen et al. | 361/729 |
| 7,436,676 B2 * | 10/2008 | Higuchi et al. | 361/752 |
| 2010/0271788 A1 * | 10/2010 | Inoue et al. | 361/748 |

FOREIGN PATENT DOCUMENTS

| JP | 02-264922 A | 10/1990 |
| JP | 03-092485 U | 9/1991 |
| JP | 05-110268 A | 4/1993 |
| JP | 10-115835 A | 5/1998 |

OTHER PUBLICATIONS

International Search Report, PCT/JP2008/002937, International Filing Date Oct. 16, 2008.

* cited by examiner

*Primary Examiner* — Yuriy Semenenko
(74) *Attorney, Agent, or Firm* — Seed IP Law Group PLLC

(57) ABSTRACT

A circuit board module includes: a board having a mounting surface; an electronic component mounted on the mounting surface; a frame which is mounted on the mounting surface so as to surround the electronic component; a resin portion which is provided inside the frame and closely contacts the electronic component, the mounting surface, and the frame; and a lid portion which covers the electronic component, and which is connected to the frame. The lid portion includes a flat portion which is provided at a region containing an area corresponding to the electronic component not covered with the resin portion and which protrudes outward more than the other regions.

3 Claims, 6 Drawing Sheets

CIRCUIT BOARD MODULE AND ELECTRONIC APPARATUS

TECHNICAL FIELD

The present invention relates to a circuit board module and an electronic apparatus.

BACKGROUND

In a circuit board module 100 shown in FIG. 6, a tubular frame 103 is connected to a connection terminal 104 of a base member 101 through solder so as to surround a plurality of electronic components 102 mounted on the base member 101. After a filler 105 filled into the frame 103 hardens, for example, a cover body 107 of a metal shield cover, etc., is put on the frame 103 and next a display device 108 (a holder 108A and a liquid crystal main body 108B) are fixed to the cover body 107.

In the circuit board module 100, the filling amount of the filler 105 is previously determined so that a top face 105A of the filler 105 is positioned along the same face as a top portion 103A of the frame 103. Therefore, after the filler 105 hardens, the top face 105A of the filler 105 supports the display device 108 through the cover body 107.

One of circuit boards is configured so that an electronic component is housed in a hole of a holder provided on a base member and the holder supports a main display unit (for example, refer to Patent Document 1).

Patent Document 1: JP-A-10-115835

DISCLOSURE OF THE INVENTION

Problems to be Solved by the Invention

Recently, there is a need for a further thinner circuit board module. For such a need, in the circuit board module in FIG. 6, for example, if the mounted electronic components contain an electronic component taller than other electronic components by one step, it is considered that the height dimension of the frame is set so that the top portion of the electronic component contacts the cover body. However, such a configuration is not preferable because there is a possibility that the tall electronic component may be short-circuited.

In Patent Document 1, the face of the holder which houses the electronic components is formed in a convexo-concave face because of the electronic component. When the display device is placed on the convexo-concave face, if a predetermined pressure applies to electronic apparatus, stress concentration occurs in the display device, and a failure such as breakage of glass of the display device may occur.

The invention was made in order to solve the above-described problems, and an object thereof is to provide a circuit board module which can be thinned even if mounted electronic components contain an electronic component taller than other electronic components by one step, and to provide an electronic apparatus including the circuit board module.

Means for Solving the Problems

A circuit board module of the invention includes: a board having a mounting surface; electronic components mounted on the mounting surface; a frame which is mounted on the mounting surface so as to surround the electronic components; a resin portion which is provided inside the frame and which closely contacts the electronic components, the mounting surface, and the frame; and a lid portion which covers the electronic components and which is connected to the frame, wherein the lid portion includes a flat portion which is provided at a portion containing an area corresponding to an electronic component not covered with the resin portion and which protrudes outward than portions other than the portion.

For example, if a component taller than other electronic components by one step is contained, the tall electronic component can protrude from a resin filling portion forming a resin portion. According to the configuration described above, the electronic component protruding from the resin filling portion is covered with the flat portion that is provided so as to protrude from the lid portion. Accordingly, the flat portion with convexo-concave effect on the surface of the resin portion suppressed as much as possible, in other words, hard to receive convexo-concave effect on the surface of the resin portion can be formed. Therefore, it is made possible to stably place a component likely to receive convexo-concave effect of the resin portion, such as a display device.

Preferably, at least a part of the lid portion other than the flat portion abuts a surface of the resin portion.

According to the configuration described above, the lid portion is supported by the resin portion, so that the strength of the lid portion can be enhanced.

In the circuit board module of the invention, the flat portion is formed so as to extend to an outside which exceeds the area corresponding to the electronic component not covered with the resin portion.

According to the configuration described above, the flat portion can be provided in the area which contains the area corresponding to the electronic component not covered with the resin portion and extends to an outer side area, whereby the flat portion can be enlarged.

In the circuit board module of the invention, a height of the electronic component from the board is higher than a height of the frame from the board.

According to the configuration described above, if an electronic component protruding from the frame in the height direction exists, the protruding flat portion covers the electronic component, so that the lid portion can be easily placed on the board while a short circuit between the electronic component and the lid portion is prevented.

In the circuit board module of the invention, a display device is placed in the flat portion of an outer face of the lid portion.

According to the configuration described above, the display device is placed in the flat portion with small convexo-concave effect on the surface of the resin portion. Therefore, if the display device contains a member easy to break, such as glass, when an external force acts on convexo-concave portions on the surface of the resin portion through the flat portion, any other portion (residual portion) than the flat portion in the lid portion abuts the surface of the resin portion and the force can be released to the resin portion side. Accordingly, the possibility that a member easy to break such as glass may be broken can be suppressed.

In the circuit board module of the invention, the flat portion of the lid portion has a shape and a size substantially matching a flat face of the display device.

According to the configuration described above, in the lid portion, any other portion (residual portion) than the flat portion does not protrude. Consequently, in the lid portion, the height becomes high only at the flat portion on which the display device is placed. Therefore, as the circuit board module, the thickness can be reduced for any other portion (residual portion) than the flat portion. Particularly, the flat portion has the size substantially matching the shape of the display device, in other words, the flat portion that becomes thicker is structured so as not to become larger than the area of the display device, and the area of any other portion (residual portion) than the flat portion is made large as much as possible. Consequently, the impression that the thickness the board module as a whole is low can be given.

An electronic apparatus of the invention includes the circuit board module described above.

Advantages of the Invention

According to the invention, the lid portion is provided with the flat portion protruding outward from other portions, so that the circuit board module described above wherein a component easy to receive convexo-concave effect of the resin portion can be placed in the lid portion and an electronic apparatus including the circuit board module can be provided.

Figure 1:
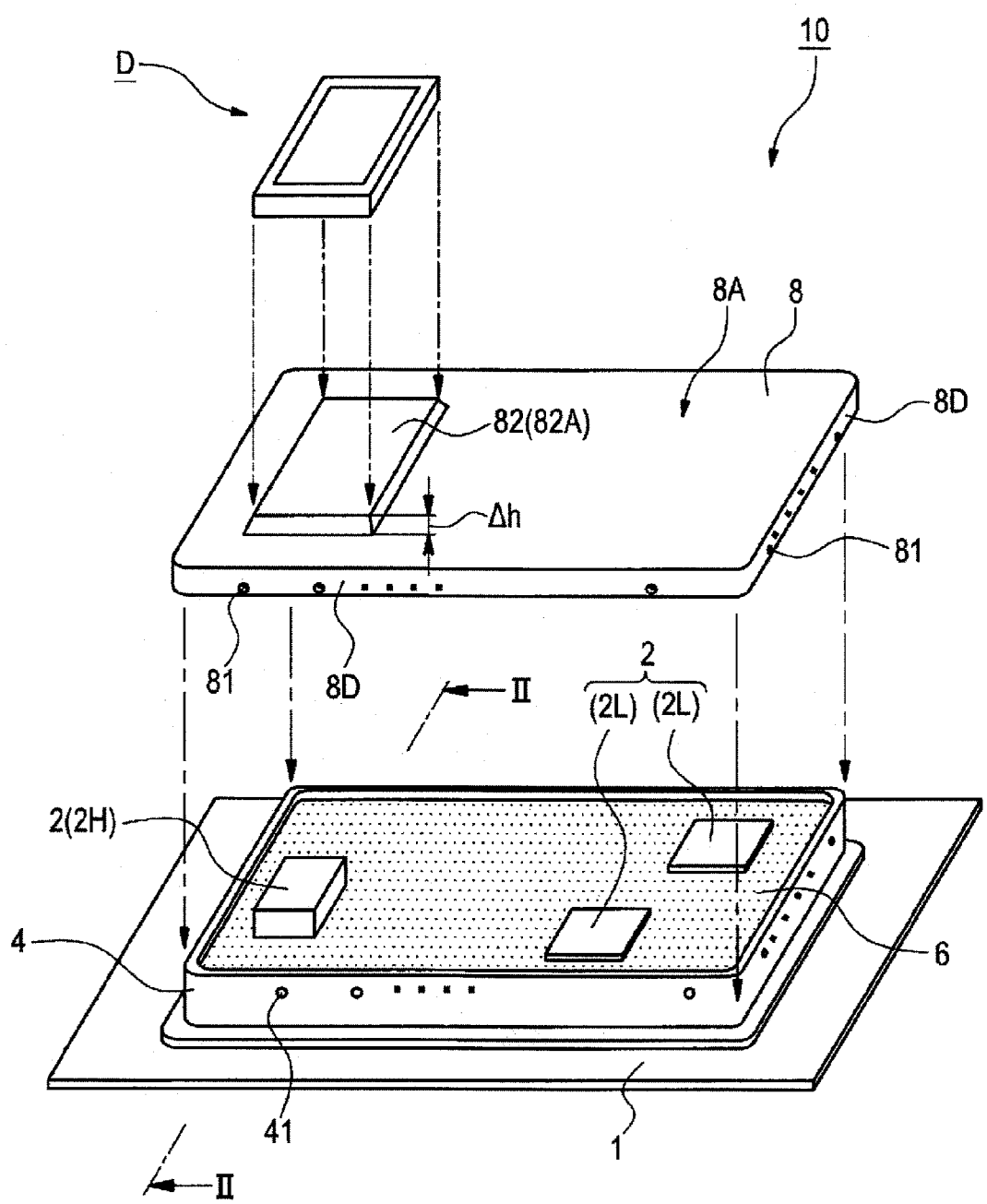
FIG. 1 is an exploded perspective view to show a circuit board module according to an embodiment of the invention.

DESCRIPTION OF REFERENCE CHARACTERS 1 board
2 electronic component
2H tall component
2L general component
21 upper face
4 frame
6 resin portion
6A surface
8 lid portion
8A upper face (of flat portion)
8C ceiling face (in residual portion)
8D side portion
82 flat portion
82A top face (in flat portion)
82B ceiling face (in flat portion)
10 circuit board module
D display device (liquid crystal display device)
S space
$\Delta S_1$ gap
$\Delta S_2$ gap

BEST MODE FOR CARRYING OUT THE INVENTION

Figure 2:
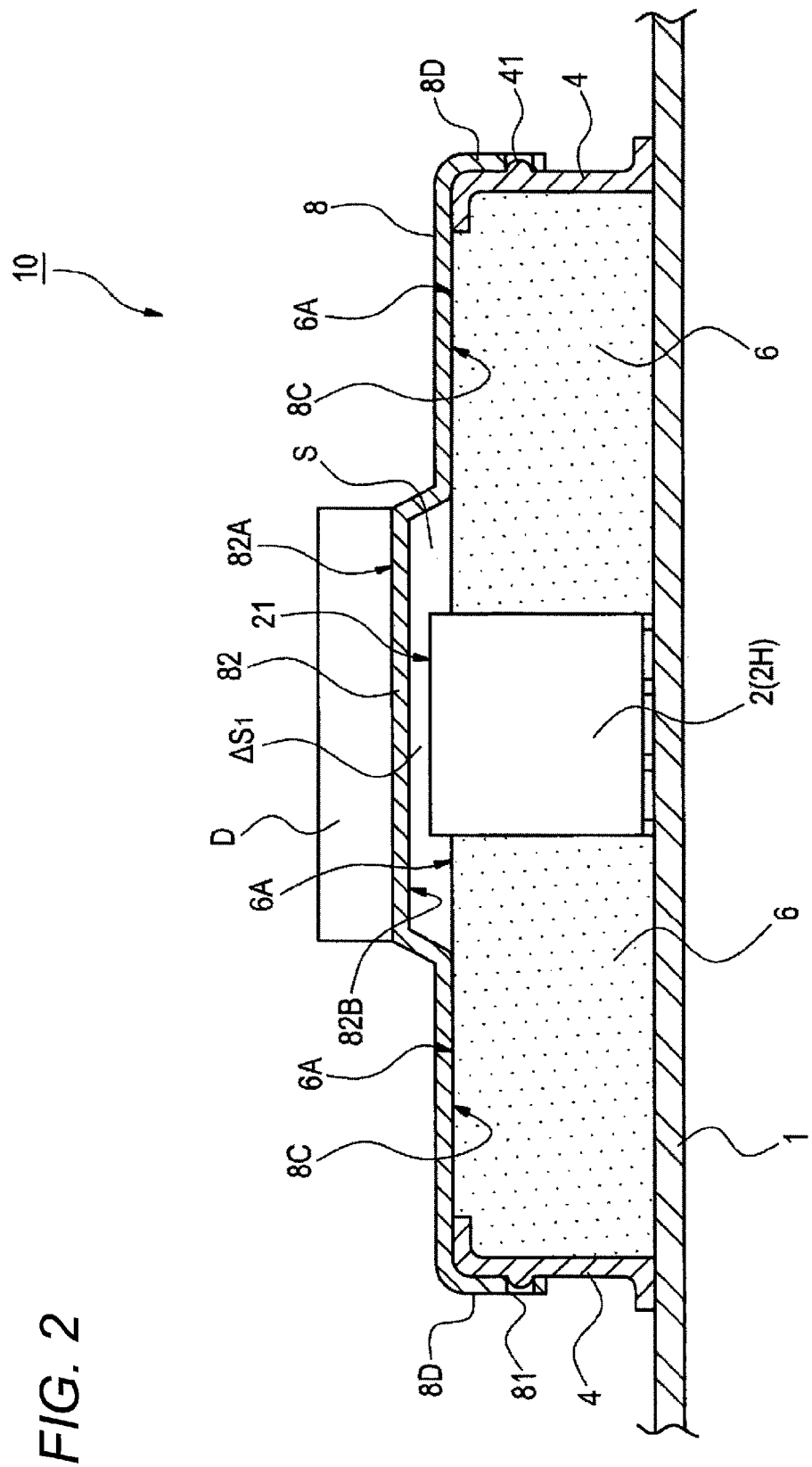
FIG. 2 is a sectional view taken on line II-II in FIG. 1.

An embodiment of the invention will be discussed below in detail with reference to the accompanying drawings:

FIGS. 1 and 2 show a circuit board module 10 according to the embodiment of the invention. The circuit board module 10 is mounted in a casing of a mobile telephone not shown of a kind of electronic apparatus, and includes a board 1, electronic components 2, a frame 4, a resin portion 6, a lid portion 8, and a display device using liquid crystal (hereinafter, liquid crystal display device) D.

The board 1 is implemented as a thin printed board and various electronic components 2, etc., are mounted on one face (mounting surface; upper face in FIG. 1). Although not shown, a display device formed of liquid crystal, organic EL, etc., larger than the liquid crystal display device D is mounted on an opposite face (lower face in FIG. 1) of the board 1.

The electronic components 2 are electronic components, etc., containing a digital (electronic) circuit, etc., for example, and are mounted in an internal area of the frame 4 of one face of the board 1 of the mounting surface.

The electronic components 2 contain a taller electronic component (which will be hereinafter called "tall component 2H") than other electronic components (which will be hereinafter called "general components 2L"). Thus, although described later in detail, a flat portion 82 protruding one step toward the outer side (upward in FIGS. 1 and 2) is formed in a predetermined area of the lid portion 8, whereby the tall component 2H can be housed in the lid portion 8.

Figure 3:
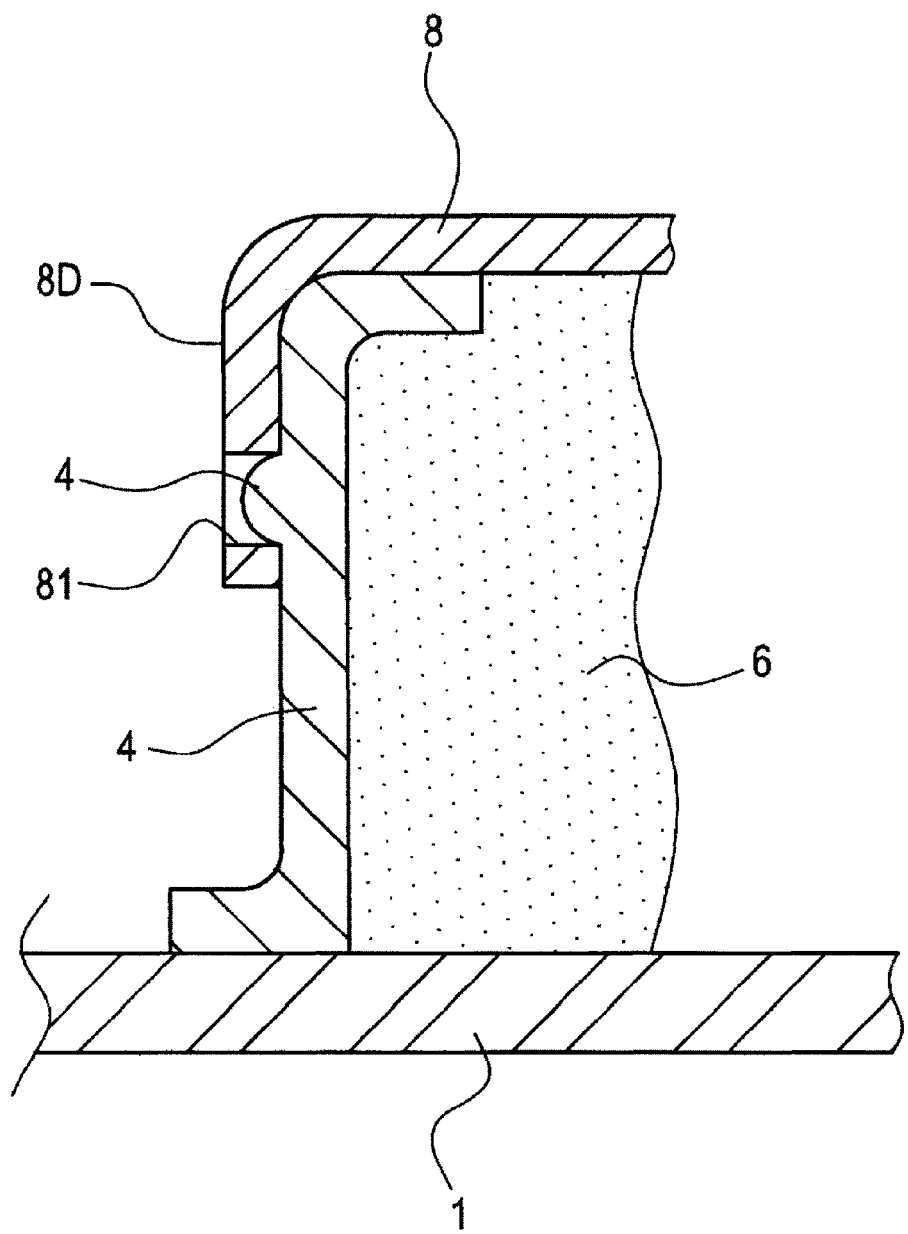
FIG. 3 is a main portion sectional view to show a connection state of a frame and a lid portion of the circuit board module according to an embodiment of the invention.

The frame 4 has a substantially rectangular tube shape, is mounted on the mounting surface of one face of the board 1, and surrounds the electronic components 2. Particularly, the frame 4 of the invention is formed of a material having electric conductivity to prevent electromagnetic radiation from leaking from the frame 4 and the lid portion 8 to the outside and block entry of unnecessary radiation from the outside by conducting electromagnetic shield (containing high-frequency shield) together with the lid portion 8. Further, as shown in FIG. 3, the frame 4 is provided with a plurality of contacts 41 throughout the outer peripheral surface to electrically connect to a hole 81 of the lid portion 8 for dropping potential to ground of the board 1 as described later and mechanically detachably fix.

The resin portion 6 is mounted on one face of the board 1, whereby given strength can be ensured for a casing of an electronic apparatus of a mobile telephone, etc., if the board 1 thinner than the conventional board is used. In other words, while the resin portion 6 formed on one face of the thin board 1 ensures given strength about the casing portion of the electronic apparatus, reduced thickness can be realized. An appropriate thermosetting resin material is used for the resin portion of the embodiment.

If the resin portion 6 is filled into one face of the board 1 and is heated in a heating furnace, it can be solidified without thermal expansion or thermal shrinkage. In other words, improvements for preventing warpage, etc., from occurring after thermal hardening are provided.

The resin portion 6 exists in the frame 4 and is provided so as to be in intimate contact with the electronic components 2, the mounting surface of the board 1, and the frame 4. Of electronic components 2, each of the general components 2 has an upper face not covered with the resin portion 6, but is lower than the wall face of the frame 4. On the other hand, the tall component 2H also has an upper face not covered with the resin portion 6, but is higher than the wall face of the frame 4 (see FIG. 2).

The lid portion 8 covers all electronic components 2 mounted on the board 1 physically in one piece. The lid portion 8 is formed of a material having electric conductivity together with the frame 4 and is given a electromagnetic shield function and can prevent electromagnetic radiation from leaking from the frame 4 to the outside and block entry of unnecessary radiation from the outside. As shown in FIG. 3, the lid portion 8 of the embodiment is provided with a large number of holes 81 fitted into the contacts 41 of 4 throughout the outer peripheral surface to accomplish mechanically detachable fixing to the frame 4 and electric connection to the frame 4.

Further, the lid portion 8 has the flat portion 82 protruding one step to the outside (an upper face 8A in FIG. 1) like a flat shape in a predetermined area containing an area corresponding to the tall component 2H taller by one step than other electronic components (general components 2L) of the electronic components 2, as described with FIGS. 1 and 2.

The flat portion 82 protrudes from the upper face 8A to the outside by a predetermined dimension (h by drawing, etc., for example, and the portion of a top face 82A is flat. According to the configuration, as shown in FIG. 2, in the flat part portion 82 of the lid part portion 8, a concave space S is formed on an inner side (a flat ceiling face 82B shown in FIG. 2) and is used to house the top part portion of the tall component 2H projected protruding from a surface 6A (see FIG. 2) of the resin part portion 6. A slight gap (S1 is formed between the ceiling face 82B of the flat part portion 82 and an upper face 21 of the tall component 2H.

The flat portion 82 contains an area corresponding to the mount area of the tall component 2H just above the tall component 2H and is formed as a size and a shape protruding to the outside enlarged wider than the area, and the liquid crystal display device D is placed substantially on the whole of the flat top face 82A of the flat portion 82. This means that the flat portion 82 is formed so that the size of the top face 82A substantially matches the mounting area of the liquid crystal display device D.

The surface 6A of the resin portion 6 abuts a ceiling face 8 C (lower face in FIG. 2) in an area other than the flat portion 82 (which will be hereinafter called "residual portion") in a portion except four side portions 8D of the outer face of the lid portion 8 of the embodiment, namely, a center portion containing the flat portion 82. Accordingly, if an external force acts on the liquid crystal display device D, most of the external force is released from the surface 6A of the resin portion 6 to the resin portion 6 side, whereby breakage of the liquid crystal display device D or the like can be circumvented.

The liquid crystal display device D is placed on the top face 82A of the flat portion 82 protruding toward the outside of the lid portion 8, as described above. As the placement method, the liquid crystal display device D may be fixedly secured to the top face 82A or may be placed on the top face 82A of the flat portion 82 so that it is fixed to a member forming a part of the casing of a mobile telephone not shown housing the circuit board module 10.

Therefore, according to the embodiment, if an external force acts on the liquid crystal display device D in such a manner that an operator presses the liquid crystal display device D with a finger by mistake, most of the external force is released to the surface 6A of the resin portion 6, whereby breakage of the liquid crystal display device D or the like can be circumvented. That is, the ceiling face (lower face in FIG. 2) in the residual portion described above abuts the surface 6A of the resin portion 6. According to the configuration, if an external force acts on the liquid crystal display device D, most of the external force is released from the surface 6A of the resin portion 6 to the resin portion 6 side, whereby the external force can be lessened, so that breakage of glass, etc., of the liquid crystal display device D can be circumvented.

In the embodiment, each of the general components 2L of the electronic components 2 has the upper face not covered with the resin portion 6, but is lower than the wall face of the frame 4. On the other hand, the tall component 2H also has the upper face not covered with the resin portion 6, but is higher than the wall face of the frame 4. That is, the lid portion 8 has the flat portion 82 protruding outward from other portions in the portion containing the area corresponding to the tall component 2H taller by one step than the general components 2L of the electronic components 2. In other words, in the circuit board module 10 of the invention, the height of the tall electronic component 2H of the electronic components 2 from the board 1 is higher than the height of the frame 4 from the board 1.

According to the configuration, if an electronic component 2 protruding from the frame 4 in the height direction exists, the protruding flat portion 82 covers the electronic component, so that the lid portion 8 can be placed on the board 1 while short circuit between the electronic component and the lid portion is prevented. The thickness of the circuit board module 10 can be made small in any other area than the area where the flat portion 82 exists.

The invention can be embodied in various forms. For example, the contacts 41 of the frame 4 need not necessarily exist throughout the peripheral surface and may be provided at least in a part thereof. The display device D may be organic EL, etc.

Figure 4:
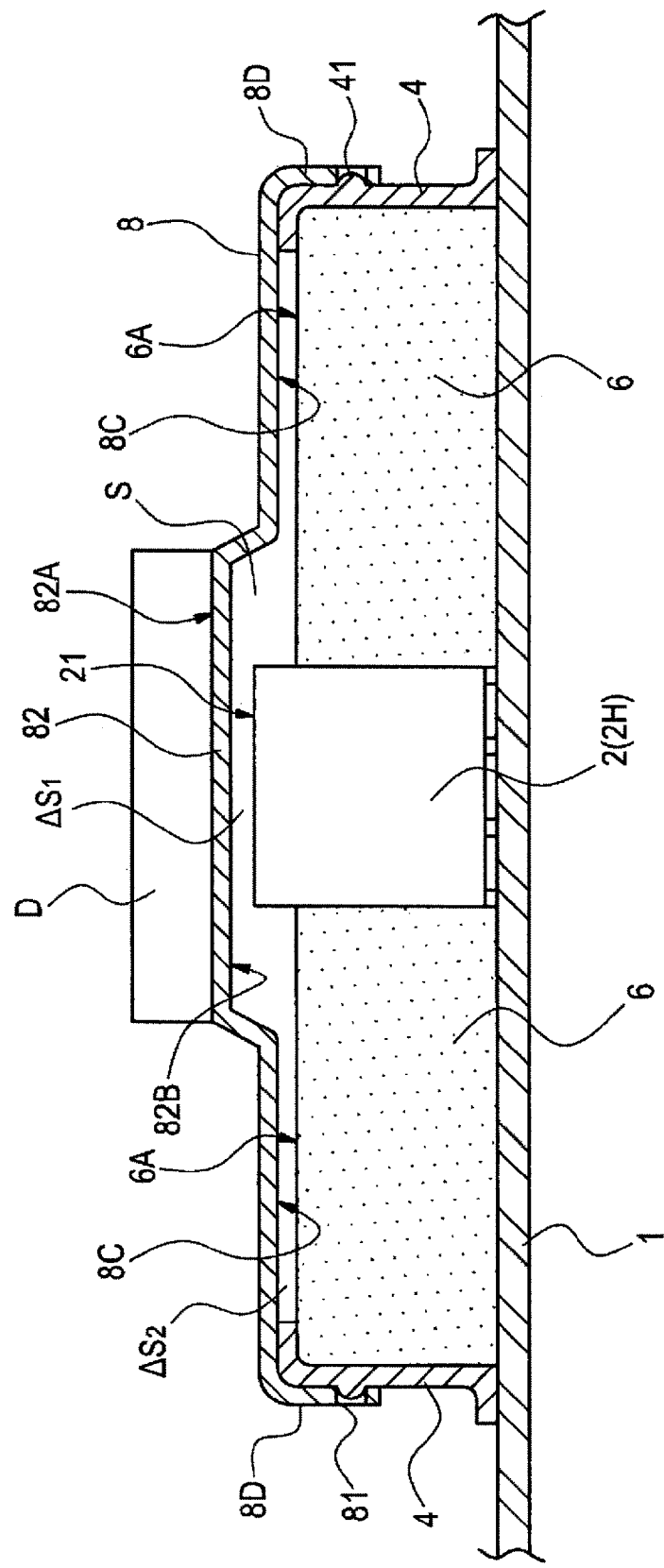
FIG. 4 is a sectional view taken on line II-II in FIG. 1 to show a modified example of the circuit board module according to the embodiment of the invention.
Figure 5:
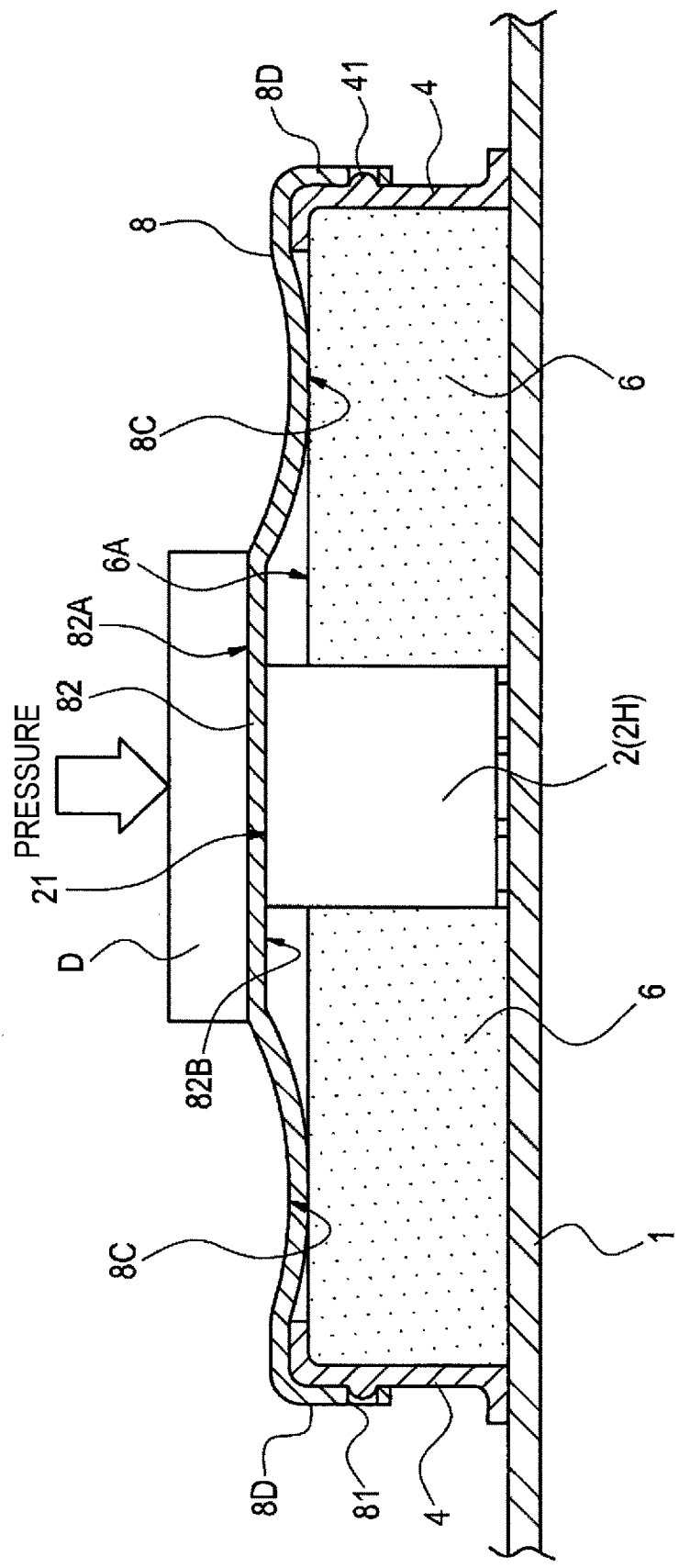
FIG. 5 is a schematic representation to show operation in the modified example of the circuit board module shown in FIG. 4.
Figure 6:
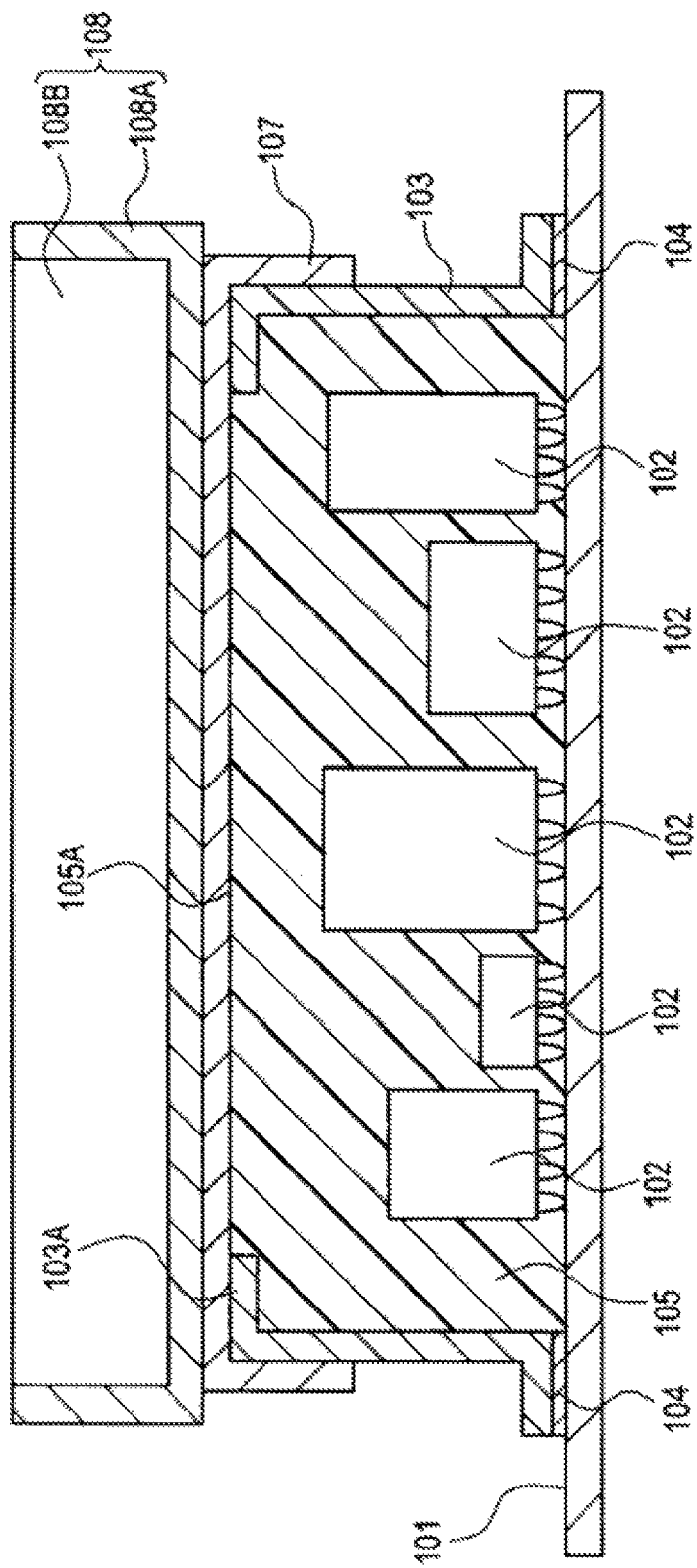
FIG. 6 is a main portion sectional view to show the board structure of a conventional mobile terminal apparatus, etc.

The circuit board module 10 may be configured so that a noncontact state having a slight gap $\Delta S_2$ exists as shown in FIG. 4 rather than the configuration in which the surface 6A of the resin portion 6 abuts a ceiling face 8C of the lid portion 8 as shown in FIG. 2 in the embodiment. Even in that configuration, for example, if an external force acts on the liquid crystal display device D, as shown in FIG. 5, the ceiling face 82B of the flat portion 82 abuts the upper face 21 of the tall component 2H and in addition, the lid portion 8 becomes deformed so as to bend, whereby the ceiling face 8C in almost all areas (residual portion) except the flat portion 82 of the lid portion 8 abuts the surface 6A of the resin portion 6. Accordingly, for example, trouble such that stress concentrates on the liquid crystal display device D and glass, etc., thereof can be prevented.

In the embodiment, the circuit board module 10 is mounted in the casing of a mobile telephone of a kind of electronic apparatus; it can be mounted in various types of casings of straight type, folding type, etc., as the mobile telephone. Further, the circuit board module can be mounted in various electronic apparatuses of a PDA (Personal Digital Assistant), PHS (Personal Handyphone System), etc., for example, as well as the mobile telephone.

While the embodiment of the invention has been described, it is to be understood that the invention is not limited to the items shown in the embodiment described above and the invention is also intended for those skilled in the art to make modifications and application based on the Description of the invention and well-known arts and the modifications and the application are contained in the scope to seek protection.

This application is based on Japanese Patent Application (No. 2008-005458) filed on Jan. 15, 2008, which is incorporated herein by reference.

INDUSTRIAL APPLICABILITY

According to the circuit board module of the invention, if mounted electronic components contain an electronic component taller than other electronic components by one step, a short circuit of the electronic components can be prevented and reduced thickness can be accomplished. Thus, the circuit board module is useful for mounted in a mobile telephone, a PDA, a PHS, other various electronic apparatuses, etc., for example.

The invention claimed is:

1. An electronic apparatus comprising:

a board having a mounting surface;

an electronic component mounted on the mounting surface;

a frame which is mounted on the mounting surface so as to surround the electronic component;

a resin portion which is provided inside the frame and which closely contacts the electronic component, the mounting surface, and the frame; and a lid portion which covers the electronic component and which is connected to the frame, wherein the lid portion includes a first region and a second region other than the first region, the first region containing an area corresponding to the electronic component not covered with the resin portion, wherein the lid portion comprises a flat portion which is provided at the first region and which protrudes outward more than the second region, wherein a height of the electronic component from the board is higher than a height of the frame from the board, wherein a display device is placed in the flat portion, and wherein the flat portion has a shape and a size substantially matching a flat face of the display device.

2. The electronic apparatus according to claim 1, wherein a part of the second region of the lid portion abuts a surface of the resin portion.

3. The electronic apparatus according to claim 1, wherein the flat portion is formed so as to extend to an outside which exceeds the area corresponding to the electronic component not covered with the resin portion.

* * * * *